(12) United States Patent
Furuya

(10) Patent No.: US 7,693,694 B2
(45) Date of Patent: Apr. 6, 2010

(54) SHAPE SIMULATION METHOD, PROGRAM AND APPARATUS

(75) Inventor: Atsushi Furuya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 928 days.

(21) Appl. No.: 11/335,609

(22) Filed: Jan. 20, 2006

(65) Prior Publication Data

US 2007/0100553 A1    May 3, 2007

(30) Foreign Application Priority Data

Oct. 27, 2005   (JP)   ............... 2005-312612

(51) Int. Cl.
*G06F 9/455*   (2006.01)

(52) U.S. Cl. ..................... 703/6

(58) Field of Classification Search ............ 703/6, 703/13; 355/55, 53; 117/103, 89; 438/691; 257/211, 295; 118/726; 219/444.1; 430/7
See application file for complete search history.

(56) References Cited

U.S. PATENT DOCUMENTS

| 5,298,775 | A  | * | 3/1994 | Ohya ................. 257/211 |
| 6,110,291 | A  | * | 8/2000 | Haruta et al. .......... 118/726 |
| 6,488,771 | B1 | * | 12/2002 | Powell et al. .......... 117/89 |
| 6,665,049 | B1 | * | 12/2003 | Takahashi ............. 355/53 |
| 2001/0026896 | A1 | * | 10/2001 | Nishikawa et al. ....... 430/7 |
| 2002/0158060 | A1 | * | 10/2002 | Uchiyama et al. ....... 219/444.1 |
| 2002/0171815 | A1 | * | 11/2002 | Matsuyama et al. ...... 355/55 |
| 2004/0123796 | A1 | * | 7/2004 | Nagai et al. ........... 117/103 |
| 2005/0006680 | A1 | * | 1/2005 | Song et al. ............ 257/295 |
| 2005/0020083 | A1 | * | 1/2005 | Numanami et al. ....... 438/691 |
| 2005/0174473 | A1 | * | 8/2005 | Morgan et al. .......... 348/370 |

FOREIGN PATENT DOCUMENTS

JP    2000-340476    12/2000

\* cited by examiner

*Primary Examiner*—Paul L Rodriguez
*Assistant Examiner*—Kandasamy Thangavelu
(74) *Attorney, Agent, or Firm*—Staas & Halsey LLP

(57) ABSTRACT

A simulation environment establishment unit constructs a three-dimensional virtual space for a simulation, where a plurality of lattice points is orthogonally arranged as well as ensures in a storage step a storage region storing information for each of the plurality of lattice points. A surface shape processing unit sequentially grows and changes a material surface shape in the three-dimensional virtual space in accordance with manufacturing process conditions, calculates a level value representing a distance from the material surface for each lattice point, and stores the level value into a storage region of a corresponding lattice point to represent the surface shape. A material inside information processing unit calculates material inside information within the material when the surface passes through a lattice point due to the growth and change in the material and stores the material inside information into a storage region of a corresponding lattice point.

12 Claims, 13 Drawing Sheets

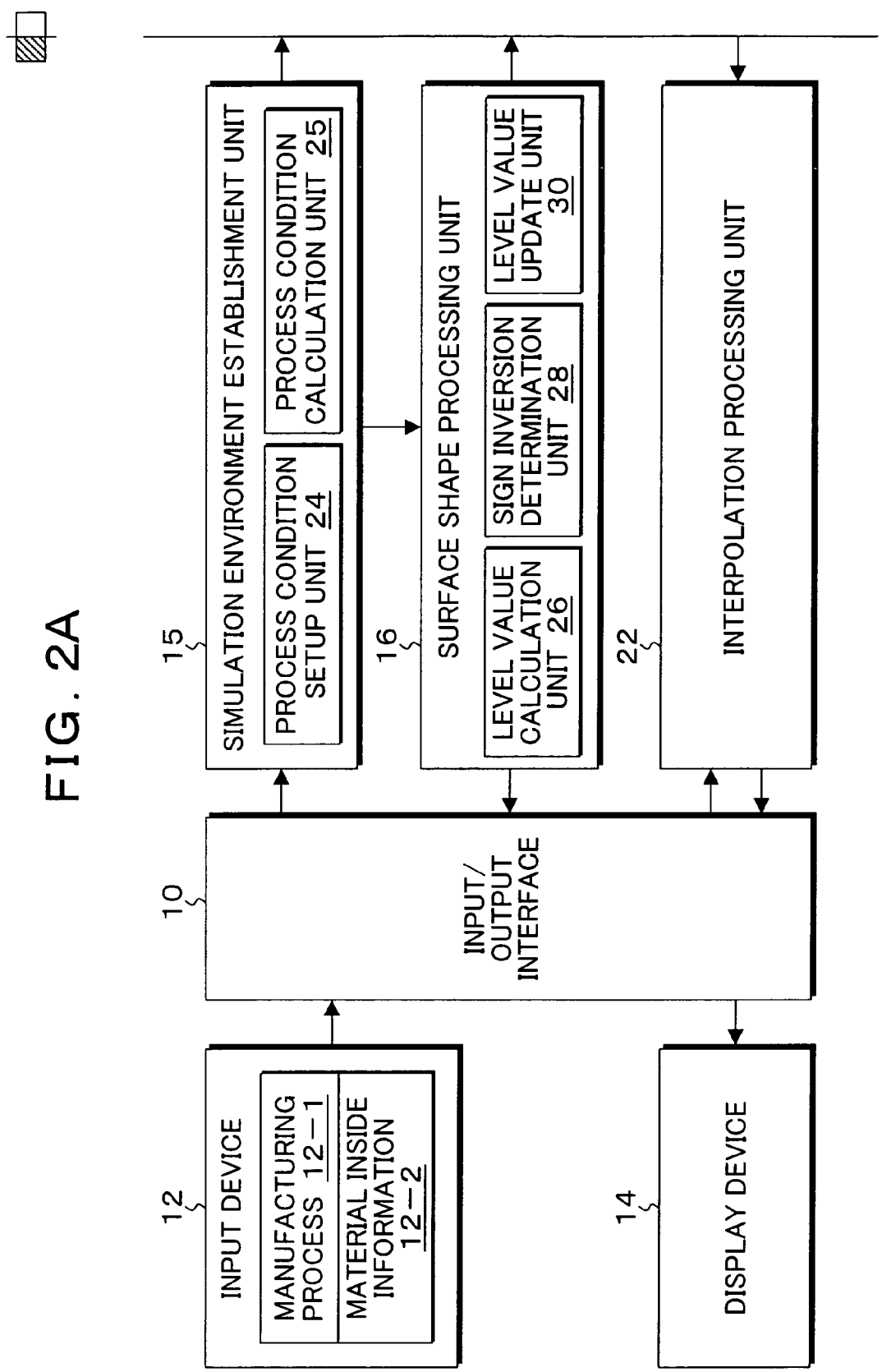

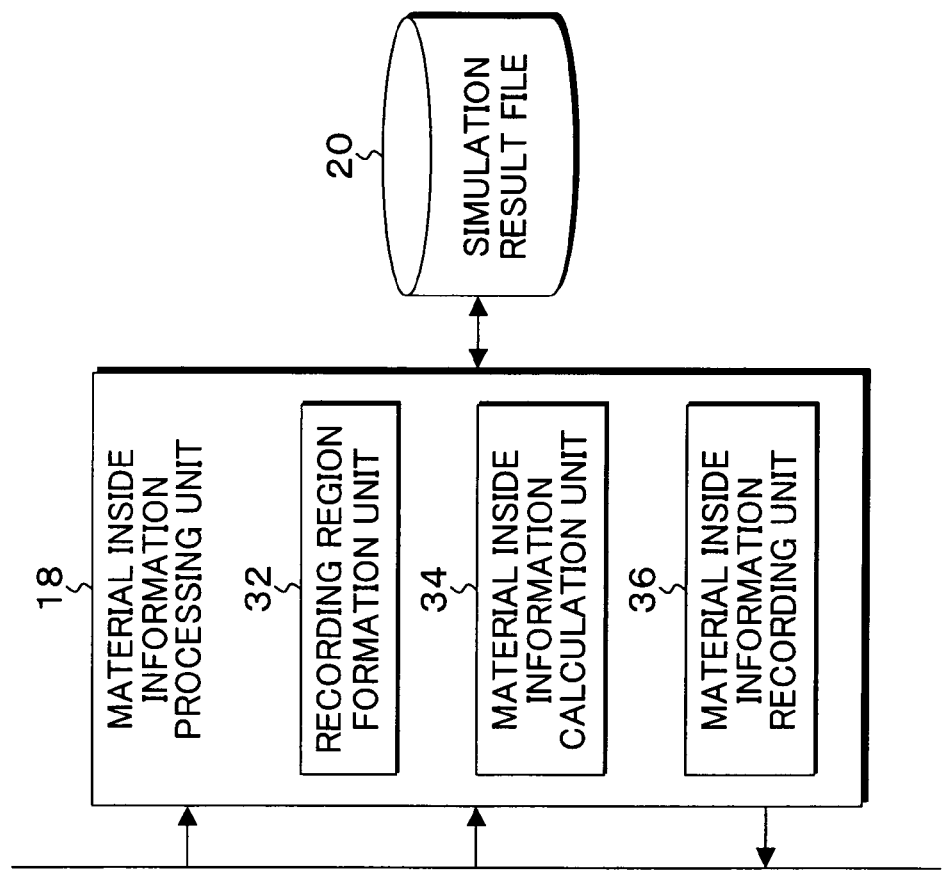

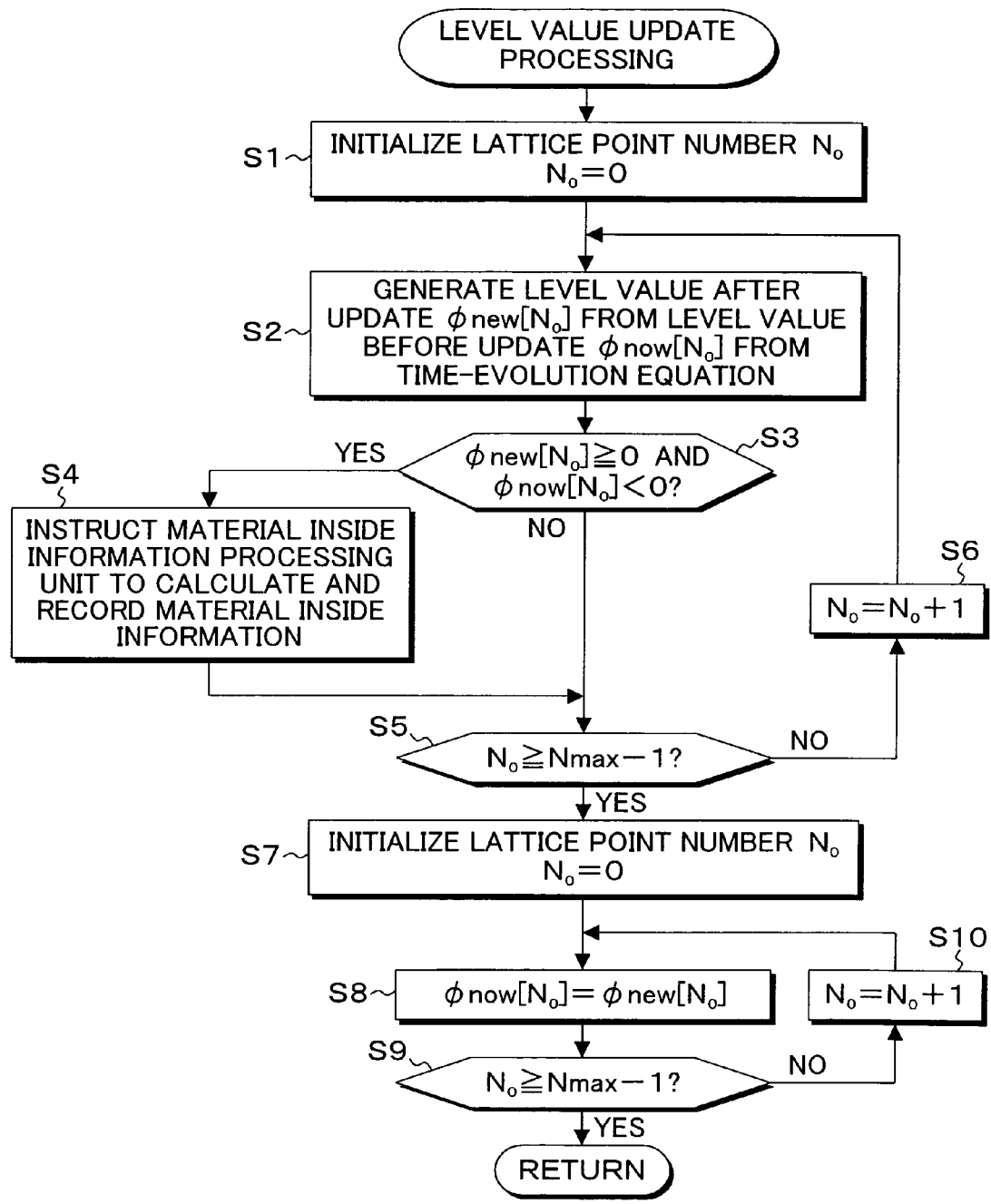

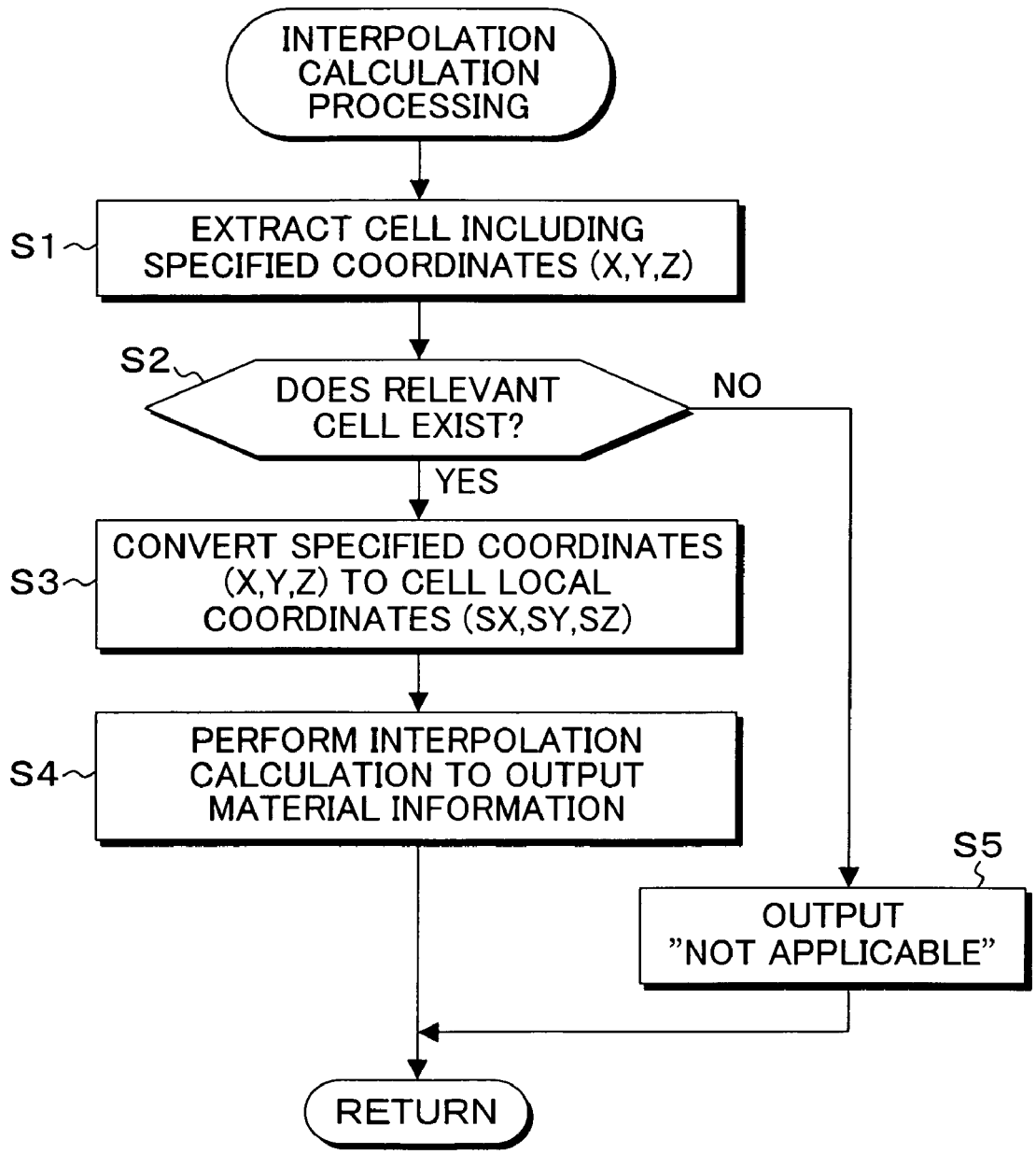

SHAPE SIMULATION METHOD, PROGRAM AND APPARATUS

CROSS-REFERENCE TO RELATED APPLICATION

This application claims the benefit of priority to prior application No. JP2005-312612, filed Oct. 27, 2005 in Japan, of which full contents are incorporated herein by reference.

BACKGROUND OF THE INVENTION

1. Field of the Invention

The present invention relates generally to a shape simulation method, program and apparatus generating a shape of a micro device in accordance with a wafer process for fabricating semiconductors, HDD head elements, etc., and more particularly, to a shape simulation method, program and apparatus using a level set method for setting level values representing distances from a material surface to arranged lattice points to represent a surface shape.

2. Description of the Related Art

Recently, in fabrication of semiconductors, hard disk drive head elements, etc., since elements are increasingly miniaturized, a high-accuracy shape simulation is required which includes material inside information including a growth direction of a film, etc. A shape simulation apparatus for a conventional micro device has a function for outputting a final element shape formed after a manufacturing process and uses a shape change algorithm referred to as a level set method in order to calculate a shape change in the manufacturing process and the final element shape. To represent a surface shape, the level set method constructs a two-dimensional or three-dimensional virtual space for a simulation as a background, where a plurality of lattice points (nodes) is arranged, and a surface shape is represented by giving level values $\phi$, which represent distances from a material surface, to the lattice points on the background.

FIG. 11 shows a shape representation method in the level set method in the case of a two-dimensional orthogonal lattice. An equally-spaced orthogonal lattice 100 is formed in a virtual space as a background and a material surface 102 is temporally grown in accordance with conditions of a manufacturing process in this space. Each lattice point is assigned with a level value $\phi$ representing a distance from the material surface 102 and a surface shape is represented by these level values $\phi$. A level value assigned to a lattice point ensures a memory region corresponding to the lattice point on a memory and is stored in the memory region. With regard to a shape simulation using the level set method, a proposition has been made for increasing a speed and an accuracy of a surface shape calculation in the calculation technique of the level value.

However, in such a conventional shape simulation, since a simulation result is obtained only as level values representing a surface shape of a micro device manufactured by a semiconductor process, for example, if an element characteristic analysis such as a magnetic simulation is attempted with the use of a simulation result of a head element, because of absence of internal information of material grown by a manufacturing process, e.g., material inside information indicating a film growth direction, an estimate value must be used for necessary material inside information and, therefore, it is problematic that a analysis accuracy is deteriorated. As a method for generating such material inside information, e.g., a film growth direction through a shape simulation, it is contemplated as a method that a user separately generates and inputs a model for a growth direction or that all logs of a calculation process are recorded in a shape simulation. However, in the method of generating a growth model, it is problematic that it takes a lot of trouble and time to generate a model and, in the method of recording all logs of a calculation process, it is problematic that a huge amount of memory is used and that a calculation amount is increased since necessary inside information must be calculated separately from the obtained logs.

SUMMARY OF THE INVENTION

According to the present invention there are provided a shape simulation method, program and apparatus which can generate material inside information within a material through shape simulation processing without increasing a memory usage and a calculation amount.

The present invention provides a shape simulation method. The shape simulation method comprises a simulation environment establishment step of constructing a two-dimensional or three-dimensional virtual space for a simulation, where a plurality of lattice points is arranged as well as for ensuring in a storage unit a storage region storing information for each of the plurality of lattice points; a surface shape processing step of sequentially growing and changing a material surface shape in the virtual space in accordance with manufacturing process conditions, for calculating a level value representing a distance from the material surface for each lattice point, and for storing the level value into a storage region of a corresponding lattice point to represent the surface shape; and a material inside information processing step of calculating material inside information when the surface passes through a lattice point due to the growth and change in the material and for storing the material inside information into a storage region of a corresponding lattice point. The shape simulation method of the present invention further comprises an interpolation processing step of, when a coordinate point other than the lattice points is specified, performing interpolation calculation of material inside information of the specified coordinate point based on material inside information of lattice points constituting a cube including the specified coordinate point. The material inside information processing step determines whether or not signs of the level value before and after update are inversed in the surface shape processing step, calculates material inside information if the sign inversion is determined, and stores the material inside information into a storage region of a corresponding lattice point. Material inside information calculated and stored in the material inside information processing step is a growth vector indicating a growth direction of a material surface. Material inside information calculated and stored in the material inside information processing step is a component rate of a plurality of components generating a material.

The present invention provides a shape simulation program. The shape simulation program of the present invention is operable to drive a computer to execute:

a simulation environment establishment step of constructing a virtual space for a simulation, where a plurality of lattice points is arranged as well as for ensuring in a storage step a storage region storing information for each of the plurality of lattice points;

a surface shape processing step of sequentially growing and changing a material surface shape in the virtual space in accordance with manufacturing process conditions, for calculating a level value representing a distance from the material surface for each lattice point, and for storing the level value into a storage region of a corresponding lattice point to represent the surface shape; and a material inside information processing step of calculating material inside information within the material when the surface passes through a lattice point due to the growth and change in the material and for storing the material inside information into a storage region of a corresponding lattice point.

The present invention provides a shape simulation apparatus. The shape simulation apparatus of the present invention comprises:

a simulation environment establishment unit constructing a virtual space for a simulation, where a plurality of lattice points is arranged as well as for ensuring in a storage unit a storage region storing information for each of the plurality of lattice points;

a surface shape processing unit sequentially growing and changing a material surface shape in the virtual space in accordance with manufacturing process conditions, for calculating a level value representing a distance from the material surface for each lattice point, and for storing the level value into a storage region of a corresponding lattice point to represent the surface shape; and a material inside information processing unit calculating material inside information within the material when the surface passes through a lattice point due to the growth and change in the material and for storing the material inside information into a storage region of a corresponding lattice point.

Details of the shape simulation program and apparatus according to the present invention will basically be the same as those of the shape simulation method of the present invention. According to the present invention, as a result of a shape simulation with a level set method, in addition to a surface material shape of a material, material inside information can be concurrently obtained which is a film growth direction, a composition rate, etc., determined in the course of a manufacturing process, and an analysis accuracy can be improved by analyzing an element characteristic with a magnetic simulation based on material inside information of lattice points obtained as a result of the shape simulation. For example, by obtaining a growth direction at each lattice point as the material inside information in the shape simulation, an element shape sensitive to magnetic anisotropy is analyzed in an MR head analysis using the material inside information and it is expected that an error in an element output value is decreased by half. Since a timing of calculating and storing the material inside information within the material at a lattice point may be only when a surface shape grown in accordance with a manufacturing process condition passes through a lattice point, i.e., only when signs of a level value before and after update is reversed, a processing load for calculating and storing the material inside information can be constrained. Material inside information at a point other than the lattice point can be easily and accurately obtained from the material information at a lattice point using interpolation calculation.

BRIEF DESCRIPTION OF THE DRAWINGS

FIGS. 2A and 2B are block diagrams of a functional configuration showing an embodiment of a shape simulation apparatus according to the present invention;

FIG. 10 is a flowchart of level value update processing in step S4 of FIGS. 9A and 9B; and FIG. 11 is a flowchart of interpolation calculation processing in step S10 of FIGS. 9A and 9B.

DETAILED DESCRIPTION OF THE PREFERRED EMBODIMENTS

Figure 1:
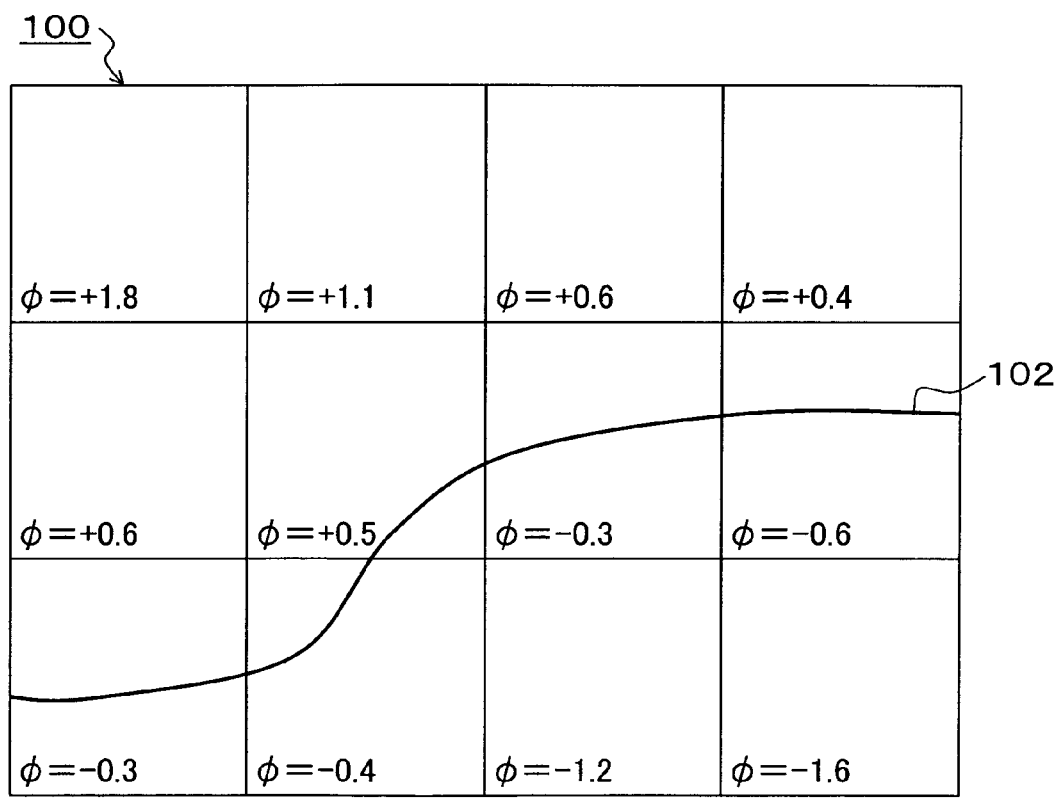
FIG. 1 is an explanatory diagram of a conventional shape simulation with a level set method.

FIGS. 2A and 2B are block diagrams of a functional configuration showing an embodiment of a shape simulation apparatus according to the present invention. In FIGS. 2A and 2B, the shape simulation apparatus of the present invention is constituted by an input/output interface 10, an input device 12, a display device 14, a simulation environment establishment unit 15, a surface shape processing unit 16, a material inside information processing unit 18, a simulation result file 20 and an interpolation processing unit 22. With the input device 12, a user specifies parameters necessary for calculating and recording material inside information in a shape simulation. For example, while watching an input screen of the display device, the user uses the input device 12 such as a keyboard and a mouse to specify a manufacturing process and material inside information 12-2 as the parameters necessary for recording calculations of material inside information. As the material inside information 12-2 specified by the user, a film growth direction and a material rate to be recorded is specified in this embodiment. The simulation environment establishment unit 15 is provided with a process condition setup unit 24 and a process condition calculation unit 25. The surface shape processing unit 16 is provided with a level value calculation unit 26, a sign inversion determination unit 28 and a level value update unit 30. The material inside information processing unit 18 is provided with a recording region formation unit 32, a material inside information calculation unit 34 and a material inside information recording unit 36. The simulation environment establishment unit 15 constructs a virtual space for a shape simulation where a plurality of lattice points is arranged on a work area on a memory as well as ensures with an instruction to the material inside information processing unit 18 a level value φ generated in a shape simulation using a level set method and a storage region for storing the material inside information 12-2 specified by the user with the input device 12 for each of the plurality of lattice points arranged in the virtual space. The surface shape processing unit 16 sequentially grows and changes a material surface shape in the simulation virtual space in accordance with manufacturing process conditions, calculates a level value φ of the level set method representing a distance from a material surface for each lattice point and stores the level value φ into a storage region of the corresponding lattice point to represent a surface shape. The material inside information processing unit 18 calculates the material inside information specified by the user, for example, a film growth direction, when a surface passes through a lattice point due to the growth and change in the material and stores the calculated material information into the storage region of the corresponding lattice point. In the embodiment of FIGS. 2A and 2B, although the surface shape processing unit 16 is provided with the sign inversion determination unit 28, this function may be provided in the material inside information processing unit 18.

Figure 3:
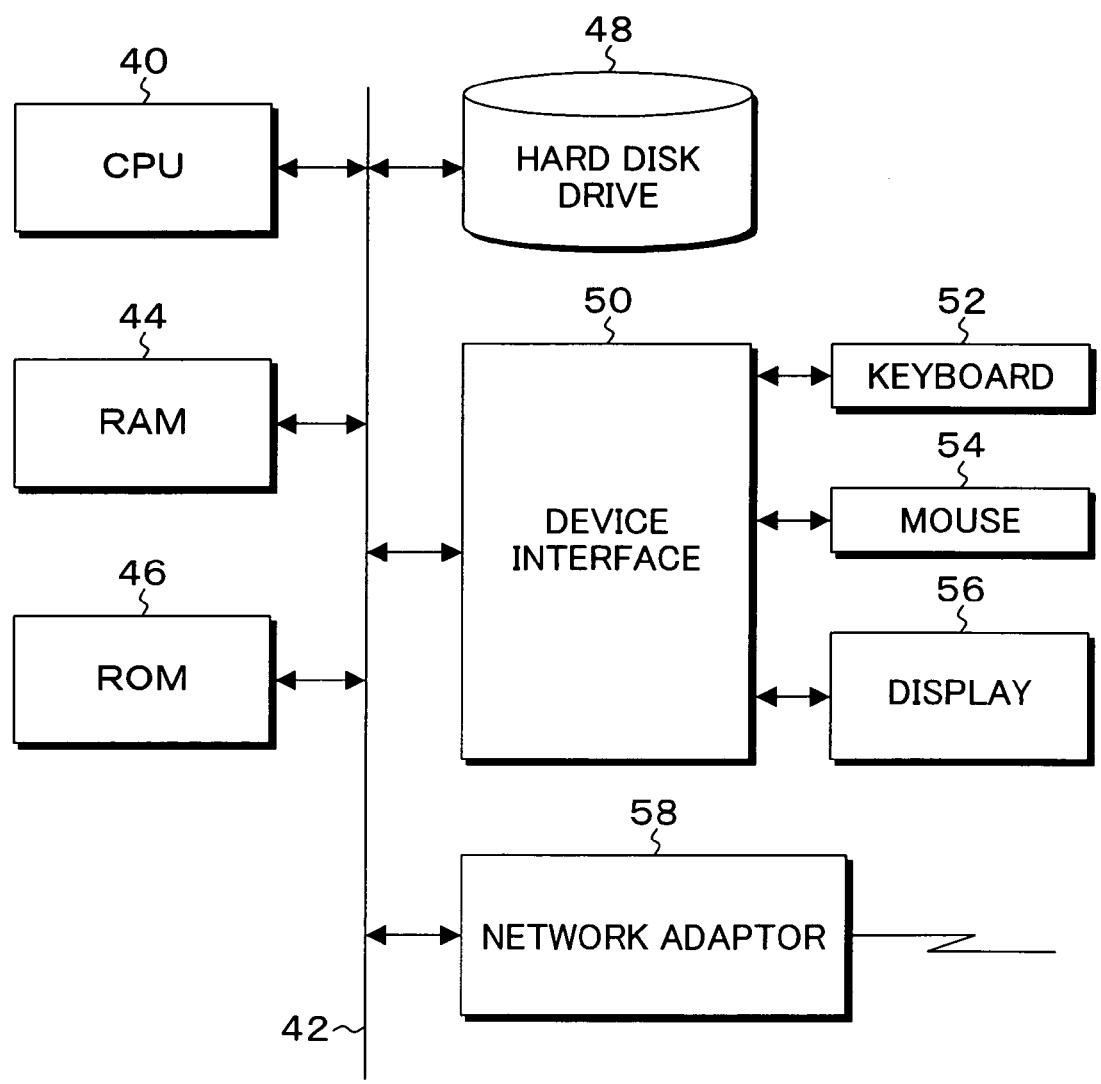
FIG. 3 is a block diagram of a hardware environment of a computer to which the embodiment of FIGS. 2A and 2B is applied.

The shape simulation apparatus of the embodiment of FIGS. 2A and 2B is realized by a hardware environment of a computer as shown in FIG. 3, for example. In the computer of FIG. 3, a bus 42 of a CPU 40 is connected with a RAM 44, a ROM 46, a hard disk drive 48, a device interface connected to a keyboard 52, a mouse 54 and a display 56, and a network adaptor 58. An application program for executing shape simulation processing is installed into the hard disk drive 48, and the application program for shape memory simulation is called from the hard disk drive when the computer starts, deployed on the RAM 44 and executed by the CPU 40. Detailed descriptions are made for the simulation environment establishment unit 15, the surface shape processing unit 16, the material inside information processing unit 18, the simulation result file 20 and the interpolation processing unit 22 provided in the embodiment of FIGS. 2A and 2B as follows.

Figure 4:
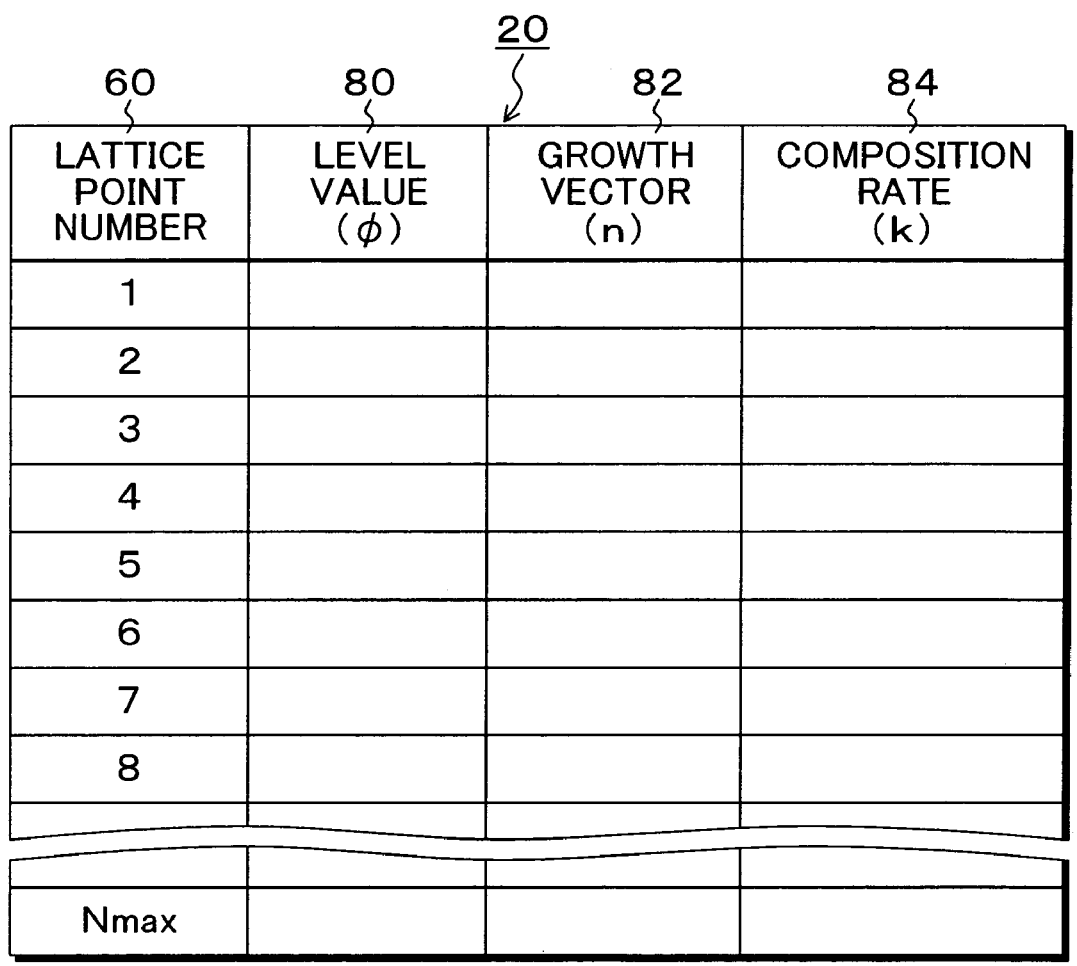
FIG. 4 is an explanatory diagram of a simulation result file of FIGS. 2A and 2B.

FIG. 4 is an explanatory diagram of the simulation result file 20 of FIGS. 2A and 2B. With regard to the simulation result file 20, specification is performed with the input device 12 for the manufacturing process 12-1 calculating and recording the material inside information and for a type of the material inside information 12-2, for example, a film growth direction or a material rate, the details specified by the user are input to the simulation environment establishment unit 15 via the input/output interface 10 and set in the process condition setup unit 24 as well as are sent to the material inside information processing unit 18 for ensuring memory regions with the recording region formation unit 32 for recording a level value $\phi$ of the level set method and the material inside information for each lattice point in the orthogonal lattice point space where the shape simulation is performed. As shown in the simulation result file 20 of FIG. 4, the memory region ensures a storage region corresponding to each item of a lattice point identification number 60, a level value 80, a growth vector 82 and a composition rate 84. The simulation environment establishment unit 15 is provided with a process condition setup unit 24 and the process condition calculation unit 25 and calculates in the process condition calculation unit 25 a surface movement speed F of the level set method at each predetermined time step $\Delta t$ based on the setting details of the user setting in the process condition setup unit 24 after the virtual space is formed for performing the shape simulation, and the surface movement speed F is output to the surface shape processing unit 16.

Figure 5:
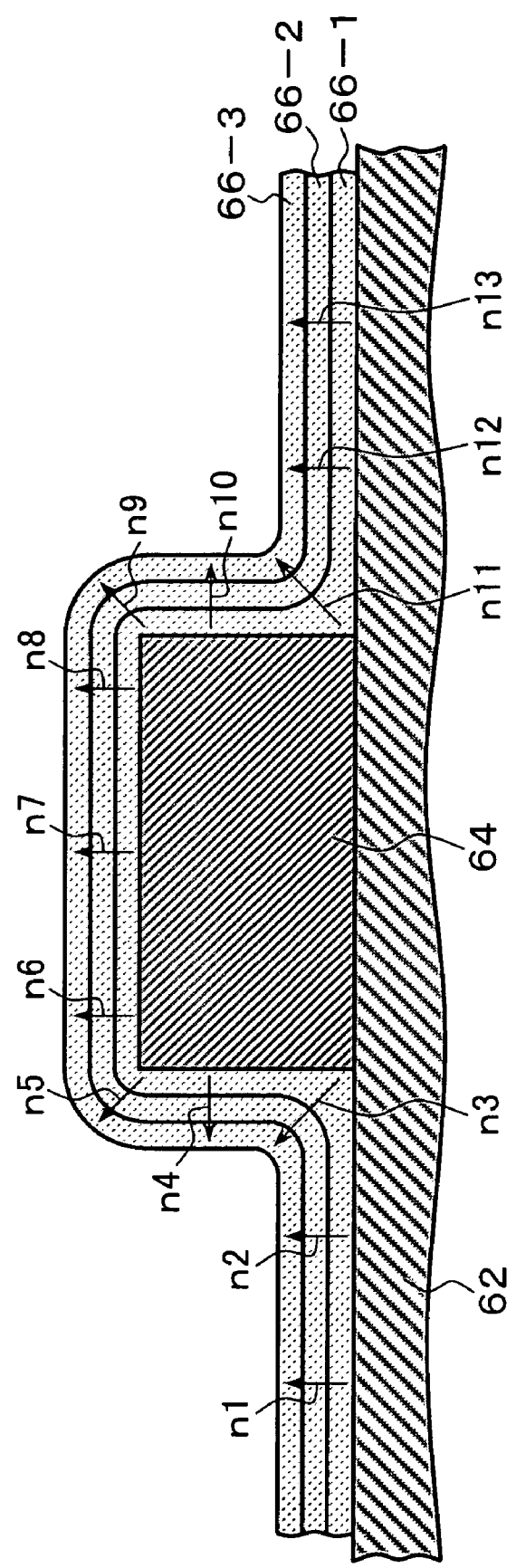
FIG. 5 is an explanatory diagram of a shape simulation for growing a film in accordance with a semiconductor manufacturing process.

FIG. 5 is an explanatory diagram of a shape simulation for growing a film in accordance with a semiconductor manufacturing process and shows how growth films 66-1, 66-2, 66-3 are sequentially formed on a material 64 disposed on a substrate 62 at each time step with plating processing, for example. Movement of a surface shape in film growth associated with such a semiconductor manufacturing process is performed in the virtual space constructed by the simulation environment establishment unit 15 and the process condition calculation unit 25 calculates the surface movement speed F in this shape simulation. The user uses the input device 12 to specify the film growth by plating of FIG. 5, which is the manufacturing process 12-1, as a target material inside information to be calculated and stored and, for example, if the inside information is a growth vector, as revealed in descriptions later, the material inside information processing unit 18 calculates growth vectors n1 to n13 shown by arrows of FIG. 5 for the lattice points, which are recorded in the data regions on the lattice points.

Referring again to FIGS. 2A and 2B, the surface shape processing unit 16 calculates and updates a level value of a lattice point based on a surface movement speed V of the level set method calculated by the process condition calculation unit 25 provided in the simulation environment establishment unit 15 and the time step $\Delta t$ as well as determines the sign inversion of the level value calculated for the lattice point in order to calculate and record the material inside information for the lattice point. The level value calculation unit 26 provided in the surface shape processing unit 16 calculates the level value based on the surface movement speed V and the time step $\Delta t$ output from the process condition calculation unit 25. The calculation of the level value after update is performed based on the following time evolution equation.

$$\delta\phi/\delta t = F|\nabla\phi| \qquad (1)$$

F is a surface movement speed prescribed by the level set method and is calculated by the process condition calculation unit 25. In practice, when a lattice point identification is [No], a post-update level value $\phi$ new [No] is calculated by a difference equation adding an amount of level change per time step $\Delta t$ in the equation 1 to a pre-update level value $\phi$ now [No]. In the case of the first-order accuracy, the difference equation is the following equation.

$$\phi new[No] = \phi now[No] + \Delta t(F|\nabla\phi now[No]|) \qquad (2)$$

The sign inversion determination unit 28 determines that the sign of the level value $\phi$ is changed from (−) to (+) at the time of updating the level value and instructs the material inside information processing unit 18 to calculate and record the inside information at the lattice point, based on the determination of the sign inversion.

Figure 6A:
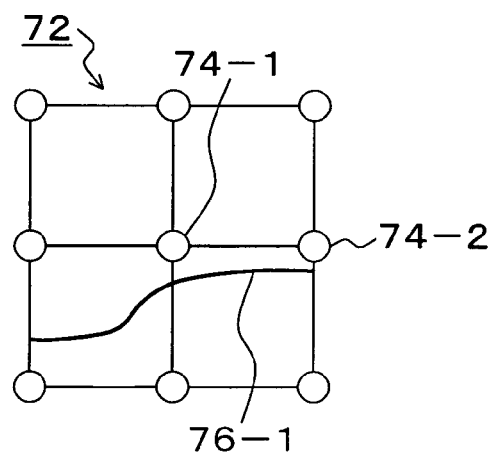
FIGS. 6A and 6B are explanatory diagrams of an orthogonal lattice space and a memory region of a lattice point before updating a level value.
Figure 6B:
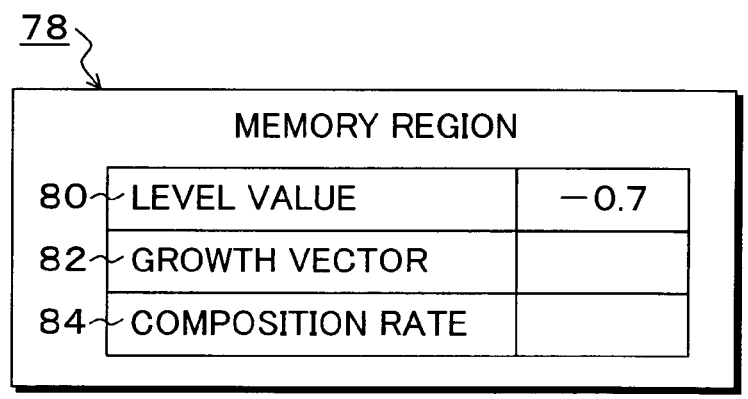

FIGS. 6A and 6B are explanatory diagrams of an orthogonal lattice space and a memory region of a lattice point before updating a level value. FIG. 6A is an orthogonal space before level update; a surface 76-1 exists under lattice points 74-1, 74-2; for example, in a memory region 78 of FIG. 6B formed for the lattice point 74-1, data regions are formed for a level value 80, a growth vector 82 and a growth rate 84; and in this case, for example, "−0.7" is stored as the level value 80, which represents a distance between the lattice point 74-1 to the surface 76-1.

Figure 7A:
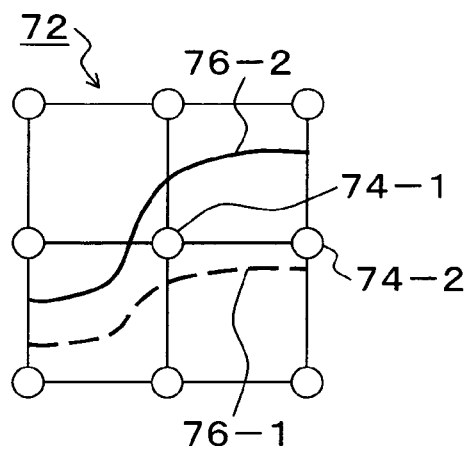
FIGS. 7A and 7B are explanatory diagrams of the orthogonal lattice space and the memory region of the lattice point after updating the level value.
Figure 7B:
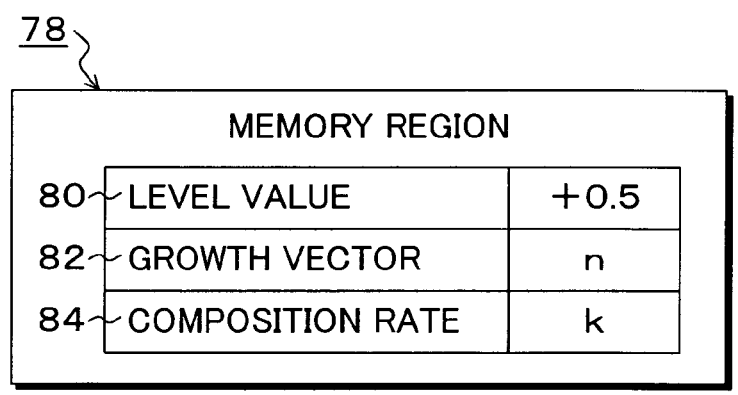

FIGS. 7A and 7B are explanatory diagrams of the orthogonal lattice space and the memory region of the lattice point after updating the level value. In FIG. 7A, the surface 76-1 before update is grown by the level value update to a surface 76-2 and it is understood that the surface passes through two (2) lattice points 74-1, 74-2 at the time of updating the level value. In the level set method, since the material inside information such as a growth vector and a material rate at the lattice point is determined at the stage of forming the material, it must be determined that the sequentially growing material surface passes through the lattice point to calculate and record the inside information at that point of time. The passage of the surface through the lattice point associated with the material growth can be captured by determining the sign inversion of the level value before and after update. In FIG. 7A, the surface 76-2 after update has passed through the lattice points 74-1, 74-2 and, in the memory region 78 of FIG. 7B corresponding to the lattice point 74-1, the level value 80 is changed to "+0.5" and the sign is inversed from (−) of the level value before update of FIG. 6B to (+) after update. Therefore, it is determined that the sign inversion occurs at the time of updating level to calculate the material inside information, for example, the growth vector 82 and the material rate 84, and a growth vector value "n" and a growth rate value "k" is recorded in the corresponding memory region.

Referring again to FIGS. 2A and 2B, the level value update unit 30 provided in the surface shape processing unit 16 executes the level value update which replace a level value φ new[No] in the lattice point calculated in the level value calculation unit 26 with a current level value φ now [No]. Based on the manufacturing process 12-1 and the material inside information 12-2 specified by the user with the input device 12, the material inside information processing unit 18 ensures, for example, the memory region as shown in FIG. 4 in the simulation result file 20 with the recording region formation unit 32. When receiving a calculation/recording instruction based on the sign inversion of the lattice point from the sign inversion determination unit 28 provided in the surface shape processing unit 16, the material inside information calculation unit 34 calculates the material inside information specified by the user, for example, the growth vector, which is recorded in the corresponding memory region. As a calculation example of the material inside information calculation unit 34, the case of calculating a film growth direction is described as follows. With regard to the film growth direction, the growth direction is calculated from the level value obtained from the surface shape processing unit 16. In the three-dimensional shape simulation, the film growth direction is represented by a vector n and can be calculated from the following equation.

$$n = \nabla \phi / |\nabla \phi| \quad (3)$$

When lattice point intervals at coordinates (I, J, K) of a three-dimensional lattice point in the x, y and z directions are Δx, Δy and Δz, respectively, a growth direction vector $$n = (n_x, n_y, n_z)$$

at the lattice point coordinates (I, J, K) can be calculated by the following equation.

$$a = (\phi(I+1,J,K) - \phi(I-1,J,K))/2\Delta x$$

$$b = (\phi(I,J+1,K) - \phi(I,J-1,K))/2\Delta y$$

$$c = (\phi(I,J,K+1) - \phi(I,J,K-1))/2\Delta z$$

$$n_x = a/\sqrt{(a^2+b^2+c^2)}$$

$$n_y = b/\sqrt{(a^2+b^2+c^2)}$$

$$n_z = c/\sqrt{(a^2+b^2+c^2)} \quad (4)$$

On the other hand, if the user specifies the material rate as the material inside information, a rate of two or more components in the manufacturing process specified by the user is obtained and recorded in the memory region of the corresponding lattice point. In this way, in the calculation and recording of the material inside information of the present invention, since the material inside information is calculated and recorded only when the sing inversion occurs at the time of updating the level value of the lattice point, the material inside information can be recorded into the lattice point with the minimum number of times of update. Since only the inside information of the lattice point is recorded in the simulation result file 20, if the material inside information is needed at coordinates other than the lattice points, the interpolation processing unit 22 obtains and outputs the material inside information at arbitrary coordinates with interpolation calculation. As the interpolation calculation method of the material inside information, the case of calculating a film growth direction is described as follows. If the user used the input device 12 to specify arbitrary coordinate position (X, Y, Z) other than the lattice points as a position for obtaining the material inside information, a cell 86 is extracted as shown in FIG. 8, which is a cube constituted by eight (8) lattice points including the coordinate position (X, Y, Z).

Figure 8:
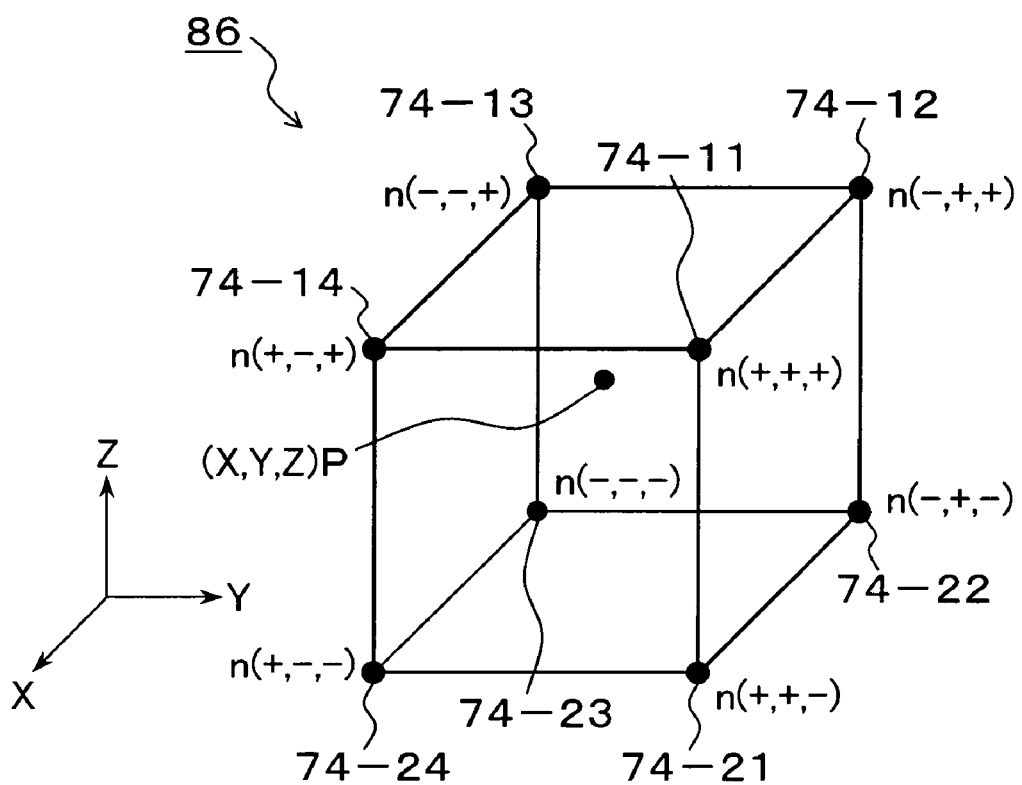
FIG. 8 is an explanatory diagram of interpolation calculation of an interpolation processing unit of FIGS. 2A and 2B.

The cell 86 of FIG. 8 includes user-specified coordinates P (X, Y, Z) and the cell 86 is constituted by eight (8) lattice points 74-11 to 74-14, 74-21 to 74-24. If such a cell 86 has been extracted, the specified coordinates P (X, Y, Z) is converted to local coordinates (SX, SY, SZ) of the cell 86. The local coordinates of the cell 86 has normalized values of −1 to +1 and an origin with SX=SY=SZ=0 is located at the center of the cell 86. With regard to the local coordinates of the lattice points 74-11 to 74-14, 74-21 to 74-24, for example, the coordinate point 74-11 shows (+1, +1, +1), which can be simplified and represented only with signs as (+, +, +). After converted to the local coordinates, a growth vector n (X, Y, Z) of the specified coordinates can be calculated by the following interpolation calculation equation.

$$n(X, Y, Z) = n(-, -, -) * (1 - SX) * (1 - SY) * (1 - SZ) + \quad (5)$$
$$n(+, +, -) * (1 + SX) * (1 + SY) * (1 - SZ) +$$
$$n(+, -, +) * (1 + SX) * (1 - SY) * (1 + SZ) +$$
$$n(+, -, -) * (1 + SX) * (1 - SY) * (1 - SZ) +$$
$$n(-, +, +) * (1 - SX) * (1 + SY) * (1 + SZ) +$$
$$n(-, +, -) * (1 - SX) * (1 + SY) * (1 - SZ) +$$
$$n(-, -, +) * (1 - SX) * (1 - SY) * (1 + SZ) +$$
$$n(+, +, +) * (1 + SX) * (1 + SY) * (1 + SZ)\}/8$$

Figure 9A:
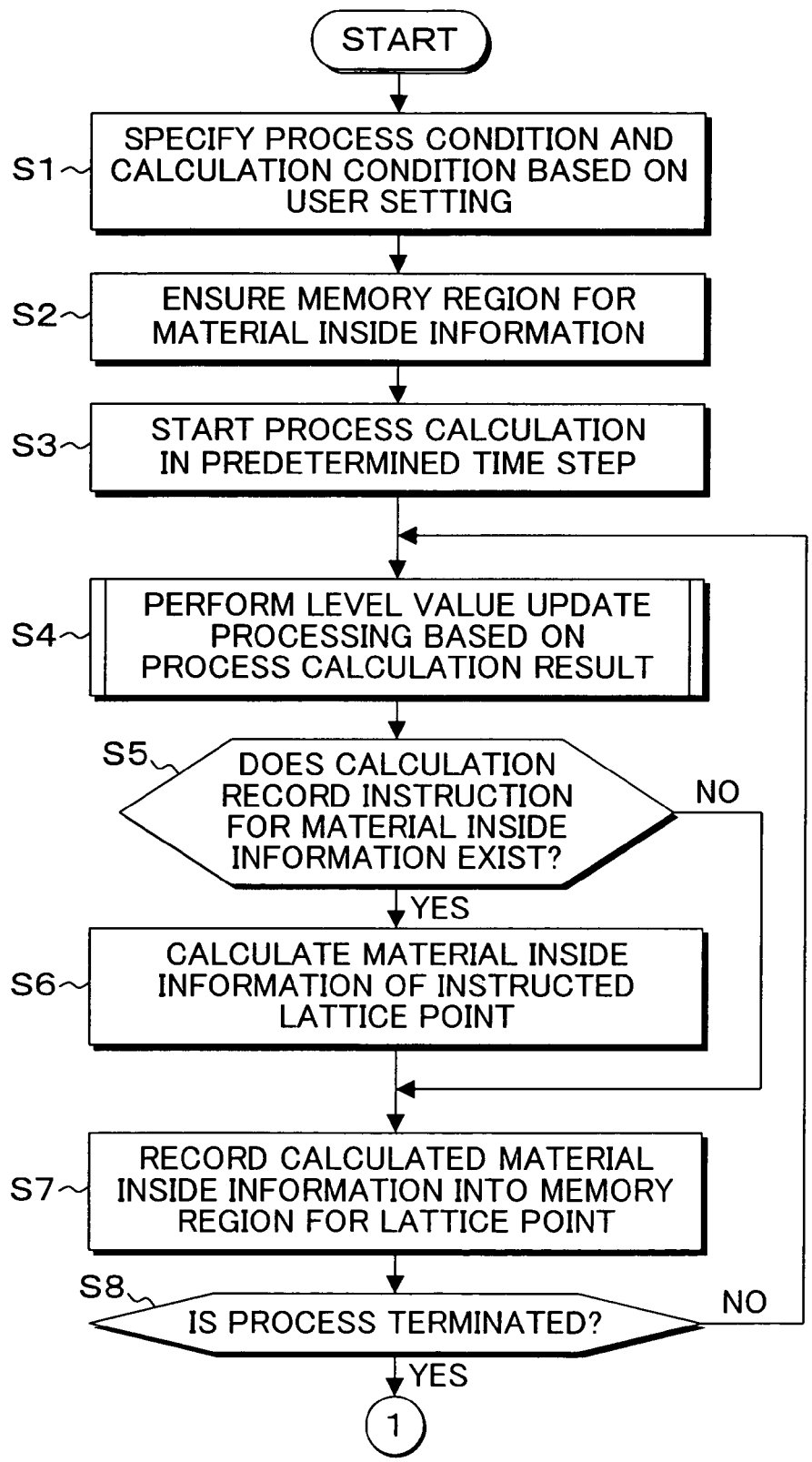
FIGS. 9A and 9B are flowcharts of the shape simulation of the embodiment of FIGS. 2A and 2B.
Figure 9B:
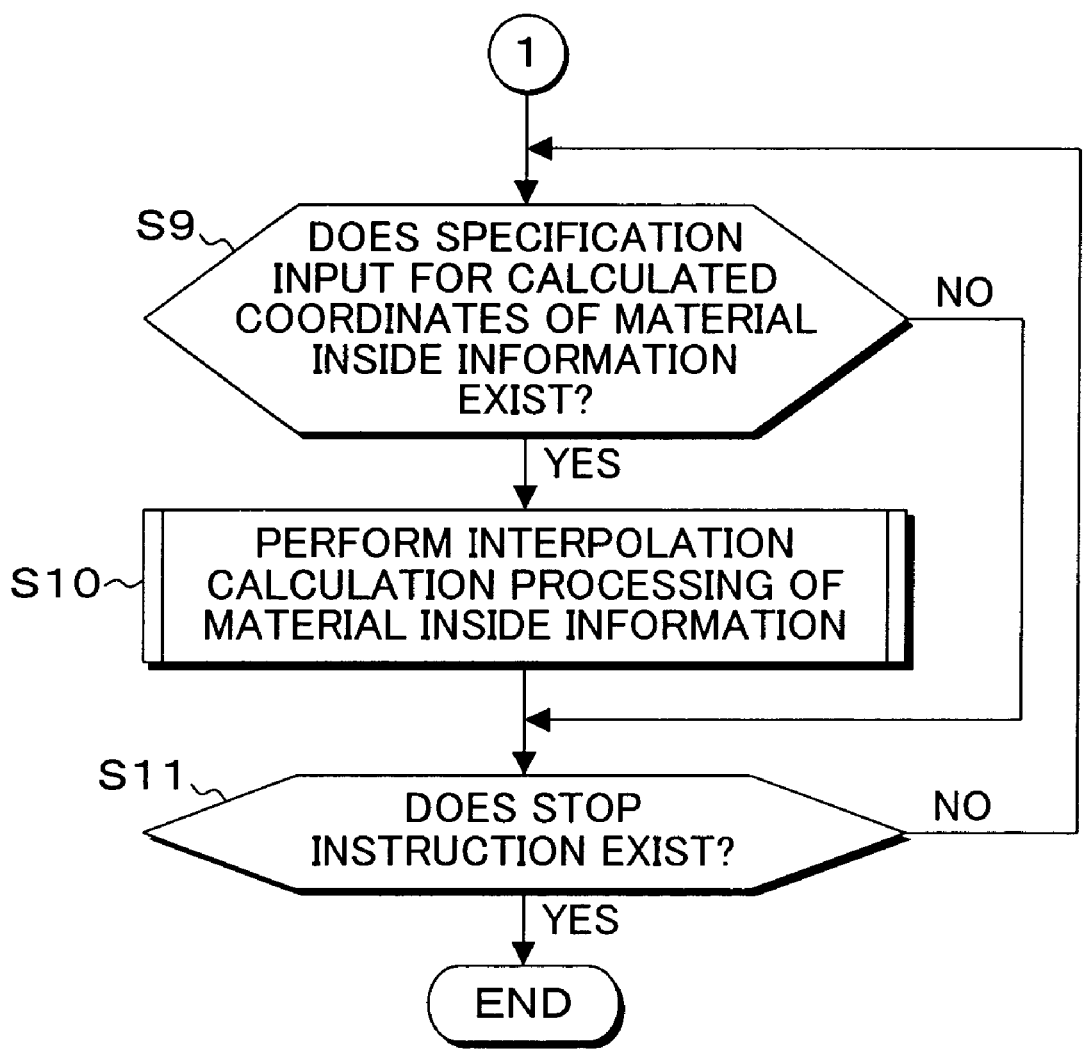

This interpolation calculation equation is the same as a linear interpolation equation in an element used in the finite element method, etc., FIGS. 9A and 9B are flowcharts showing a general procedure of the shape simulation of the embodiment of FIGS. 2A and 2B. In FIGS. 9A and 9B, in step S1, the growth process 12-1 specified by the user with the use of the input device 12 is input via the input/output interface 10 into the simulation environment establishment unit 15 and the calculation conditions are set by the process condition setup unit 24. In step S2, based on the material inside information 12-2 specified by the user with the input device 12, the recording region formation unit 32 provided in the material inside information processing unit 18 ensures the memory region with the format shown by, for example, the simulation result file 20 of FIG. 4, which ensures the memory region for recording the level value calculated by the level set method as well as the specified material inside information, for example, the growth vector and the material inside rate. In step S3, the process condition calculation unit 25 of the simulation environment establishment unit 15 starts the process condition calculation with the predetermined time step Δt to calculate the surface movement speed F of the level set method, which is output to the surface shape processing unit 16. In step S5, it is checked whether or not the material inside information processing unit 18 is instructed from the surface shape processing unit 16 to generate the material inside information for a lattice point and if the material inside information is instructed to be generated, the material inside information calculation unit 34 calculates the material inside information of the specified lattice point in step S6 and the material inside information recording unit 36 records the calculated material inside information into the memory region of the corresponding lattice point in step S7. In step S8, it is checked whether the entire process of the shape simulation are completed or not and if not completed, the procedure goes back to step S4 to repeat the level value update processing for each predetermined time step Δt. If it is determined in step S8 that the process is completed, the procedure goes to step S9 to check whether or not an output request exists for the material inside information of coordinates other than the lattice point, and if the output request exists, the procedure goes to step S10 to execute the interpolation calculation processing of the material inside information. The processing of steps S9 to S10 is repeated until a stop order exists in step S11.

FIG. 10 is a flowchart showing details of the level value update processing in step S4 of FIGS. 9A and 9B. In FIG. 10, in the level value update processing, after initialization of the lattice point number No in step S1, i.e., after No is set to zero, in step S2, the post-update level value φ new[No] is generated from the pre-update level value φ now[No] using the time evolution equation given by the equation (2). In step S3, it is determined whether the signs of the level values before and after update are inversed or not. In other words, it is checked whether or not the post-update level value φ new [No] is equal to or more than zero, i.e., zero or positive and whether or not the pre-update level value φ now[No] is less than zero, i.e., negative, and if these conditions are satisfied, i.e., if it is determined that the sign is changed from (−) to (+), in step S4, an instruction is output to the material inside information processing unit 18 for calculating and recording the material inside information of the sign-inversed lattice point. In step S5, it is checked whether or not the lattice point number No is reached to the last lattice point number by subtracting 1 from the number Nmax of the lattice points, and if not reached, in step S6, the lattice point number No is increased by 1 and the processing from step S2 is repeated. If it is determined in step S5 that the lattice point number is reached to the last number, the procedure goes to step S7 and, after initializing the lattice point number No, in step S8, update processing is performed for replacing the already calculated post-update level value φ new[No] with the current level value φ now[No] In step S9, it is determined whether the lattice point number is reached to the last number or not; if not reached, in step S10, the lattice point number No is increased by 1 and the update processing from step S8 is repeated; and when the lattice point number is reached to the last number, the level update processing is terminated and the procedure returns to the main routine of FIGS. 9A and 9B.

FIG. 11 is a flowchart of the interpolation calculation processing in step S10 of FIGS. 9A and 9B. In FIG. 11, the interpolation calculation processing extracts a cell including user-specified coordinates (X, Y, Z) other than lattice points in step S1 and checks whether a relevant cell exists or not in step S2; if the relevant cell is extracted, in step S3, the specified coordinates (X, Y, Z) is converted to cell minimum coordinates (SX, SY, SZ); and in step S4, the growth vector is calculated and output as the material information by performing the interpolation calculation in accordance with the equation (4). On the other hand, if the relevant cell cannot be extracted in step S4, non-applicability is output in step S5. The present invention provides a shape simulation program executed by a computer and the program has the program content shown in flowcharts of FIGS. 9A and 9B, FIG. 10 and FIG. 11. The present invention provides a computer readable recording medium storing the shape simulation program and the recording medium includes a portable storage medium such as a CD-ROM, Floppy Disk®, DVD, magnetic optical disk and IC card, a storage apparatus such as a hard disk provided in a computer, a database or another computer and a database thereof maintaining a program via a line, and a transmission medium on a line. The present invention encompasses any modifications without impairing the object and advantages thereof and is not intended to be limited by the numeric values shown in the embodiment.

What is claimed is:

1. A computer implemented shape simulation method for generating a surface shape of an electronic device during semiconductor manufacturing process, comprising:
    specifying manufacturing process conditions and parameters for material growth, material inside information to be computed, and a time interval for advancing a simulation process;
    defining a plurality of lattice points in a two-dimensional or three-dimensional space for the material growth and allocating memory space for storing information of each of the plurality of lattice points;
    computing growth of a material surface and changes in a material surface shape for a selected computing time of the simulation based on the manufacturing process conditions and parameters;
    computing a level value for each lattice point representing a distance from the material surface to the lattice point;
    computing material inside information if the surface passes through the lattice point due to the material growth and changes in the material surface shape;
    wherein the material inside information is computed by:
    determining if a sign of the level value at the lattice point at the selected computing time is different from the sign of the level value at the lattice point at an immediately preceding computing time indicating the sign is inverted; and
    computing the material inside information if the sign is inverted; and
    repeating the steps of computing the level value and computing the material inside information for the plurality of lattice points in the space for the material growth;
    incrementing the selected computing time of the simulation by the time interval for advancing the simulation process; and
    repeating the steps of computing the growth of the material surface and the changes in the material surface shape, computing level values and computing material inside information for the plurality of lattice points for the computing time of the simulation, until a specified termination condition is reached; and
    outputting a final surface shape formed during the manufacturing process on a display device.

2. The method according to claim 1, wherein if the material inside information of a specified coordinate point other than the lattice points is required, interpolation is performed to obtain the material inside information of the specified coordinate point from the material inside information of lattice points constituting a cube that includes the specified coordinate point.

3. The method according to claim 1, wherein the material inside information computed is a growth vector indicating a film growth direction of the material surface.

4. The method according to claim 1, wherein the material inside information computed is a component rate of a plurality of components generating the material surface.

5. A computer-readable storage medium storing computer executable instructions which when executed by a computer perform a shape simulation method for generating surface shape of an electronic device during semiconductor manufacturing process, the medium comprising instructions for:
specifying manufacturing process conditions and parameters for material growth, material inside information to be computed, and a time interval for advancing a simulation process;
defining a plurality of lattice points in a two-dimensional or three-dimensional space for the material growth and allocating memory space for storing information of each of the plurality of lattice points;
computing growth of a material surface and changes in a material surface shape for a selected computing time of the simulation based on the manufacturing process conditions and parameters;
computing a level value for each lattice point representing a distance from the material surface to the lattice point;
computing material inside information if the surface passes through the lattice point due to the material growth and changes in the material surface shape;
wherein the material inside information is computed by:
determining if a sign of the level value at the lattice point at the selected computing time is different from the sign of the level value at the lattice point at an immediately preceding computing time indicating the sign is inverted; and
computing the material inside information if the sign is inverted; and
repeating the steps of computing the level value and computing the material inside information for the plurality of lattice points in the space for the material growth;
incrementing the selected computing time of the simulation by the time interval for advancing the simulation process; and
repeating the steps of computing the growth of the material surface and the changes in the material surface shape, computing level values and computing material inside information for the plurality of lattice points for the computing time of the simulation, until a specified termination condition is reached; and
outputting a final surface shape formed during the manufacturing process on a display device.

6. The storage medium according to claim 5, wherein if the material inside information of a specified coordinate point other than the lattice points is required, interpolation is performed to obtain the material inside information of the specified coordinate point from the material inside information of lattice points constituting a cube that includes the specified coordinate point.

7. The storage medium according to claim 5, wherein the material inside information computed is a growth vector indicating a film growth direction of the material surface.

8. The storage medium according to claim 5, wherein the material inside information computed is a component rate of a plurality of components generating the material surface.

9. A shape simulation apparatus for generating a surface shape of an electronic device during semiconductor manufacturing process, comprising:
a computer with one or more processors;
an input device for specifying manufacturing process conditions and parameters for material growth, material inside information to be computed, and a time interval for advancing a simulation process;
a memory storing a program of instructions wherein the instructions when executed by the processors provide:
a simulation environment establishment unit defining a plurality of lattice points in a two-dimensional or three-dimensional space for the material growth and allocating memory space for storing information of each of the plurality of lattice points;
a surface shape processing unit computing growth of a material surface and changes in a material surface shape for a selected computing time of the simulation based on the manufacturing process conditions and parameters;
a level value calculation unit computing a level value for each lattice point representing a distance from the material surface to the lattice point; and
a material inside information processing unit computing material inside information if the surface passes through the lattice point due to the material growth and changes in the material surface shape;
wherein the material inside information is computed by:
determining if a sign of the level value at the lattice point at the selected computing time is different from the sign of the level value at the lattice point at an immediately preceding computing time indicating the sign is inverted; and
computing the material inside information if the sign is inverted;
wherein the level value calculation unit repeats computing the level value and the material inside information processing unit repeats computing the material inside information for the plurality of lattice points in the space for the material growth;
the simulation apparatus increments the selected computing time of the simulation by the time interval for advancing the simulation process; and
repeats computing the growth of the material surface and the changes in the material surface shape, computing level values and computing material inside information for the plurality of lattice points for the computing time of the simulation, until a specified termination condition is reached; and
a display device for outputting a final surface shape formed during the manufacturing process.

10. The apparatus according to claim 9, wherein if the material inside information of a specified coordinate point other than the lattice points is required, interpolation is performed to obtain the material inside information of the specified coordinate point from the material inside information of lattice points constituting a cube that includes the specified coordinate point.

11. The apparatus according to claim 9, wherein the material inside information computed is a growth vector indicating a film growth direction of the material surface.

12. The apparatus according to claim 9, wherein the material inside information computed is a component rate of a plurality of components generating the material surface.

* * * * *